(12) United States Patent
Zhang et al.

(10) Patent No.: US 8,481,389 B2
(45) Date of Patent: Jul. 9, 2013

(54) METHOD OF REMOVING HIGH-K DIELECTRIC LAYER ON SIDEWALLS OF GATE STRUCTURE

(75) Inventors: Ying Zhang, Yorktown Heights, NY (US); Qingyun Yang, Poughkeepsie, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/080,084

(22) Filed: Apr. 5, 2011

(65) Prior Publication Data

US 2012/0256278 A1    Oct. 11, 2012

(51) Int. Cl.
*H01L 21/336* (2006.01)

(52) U.S. Cl.
USPC ........... 438/270; 438/287; 438/591; 438/596; 257/411; 257/E29.133; 257/E29.255; 257/E21.159

(58) Field of Classification Search
USPC .................. 438/270, 287, 591, 596; 257/411, 257/E29.133, E29.255, E21.159
See application file for complete search history.

(56) References Cited

U.S. PATENT DOCUMENTS

| | | | |
|---|---|---|---|
| 6,750,116 B1 | 6/2004 | Chen | |
| 7,186,657 B2 * | 3/2007 | Hwang et al. | 438/705 |
| 7,557,007 B2 | 7/2009 | Shimoyama et al. | |

* cited by examiner

*Primary Examiner* — Tu-Tu Ho
(74) *Attorney, Agent, or Firm* — Scully, Scott, Murphy & Presser, P.C.; Catherine Ivers (57) ABSTRACT

A semiconductor structure, and method of forming a semiconductor structure, that includes a gate structure on a semiconductor substrate, in which the gate structure includes a gate conductor and a high-k gate dielectric layer. The high-k gate dielectric layer is in contact with the base of the gate conductor and is present on the sidewalls of the gate conductor for a dimension that is less than ¼ the gate structure's height. The semiconductor structure also includes source regions and drain regions present in the semiconductor substrate on opposing sides of the gate structure.

16 Claims, 2 Drawing Sheets

METHOD OF REMOVING HIGH-K DIELECTRIC LAYER ON SIDEWALLS OF GATE STRUCTURE

BACKGROUND

The present disclosure relates to semiconductor structures and methods of fabricating such semiconductor structures. More particularly, the present disclosure relates to semiconductor structures that include high-k gate dielectrics, and methods of fabricating such semiconductor structures.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

A method of forming a semiconductor device is provided that includes forming a replacement gate structure on a portion of a substrate, wherein source regions and drain regions are formed on opposing sides of the portion of the substrate that the replacement gate structure is formed on. An intralevel dielectric is formed on the substrate having an upper surface that is coplanar with an upper surface of the replacement gate structure. The replacement gate structure is removed to provide an opening to an exposed portion of the substrate. The sidewalls of the openings are provided by the sidewalls of the remaining portion of the intralevel dielectric that are exposed by removing the replacement gate structure. A gate dielectric layer is formed on at least the sidewalls of the opening and the exposed portion of the substrate. The majority of the gate dielectric layer that is present on the sidewalls of the opening is damaged with an angled ion implantation. The damaged portion of the gate dielectric layer is removed by a selective etch, wherein a remaining portion of the gate dielectric layer is present on the portion of the substrate that was exposed by removing the replacement gate structure. The gate conductor of a functioning gate structure is formed within the opening on the remaining portion of the gate dielectric layer. In one embodiment, the gate dielectric layer is composed of a high-k material.

In another aspect, a semiconductor device is provided. The semiconductor device includes a gate structure that is composed of a gate conductor and a high-k gate dielectric layer. The high-k gate dielectric layer is in contact with the base of the gate conductor and is in contact with the sidewalls of the gate conductor for a dimension that is less than ¼ the height of the gate structure. Source regions and drain regions are positioned on opposing sides of the gate structure.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on ", "present on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a method of removing the high-k material that provides the gate dielectric from the sidewalls of the gate conductor of a functional gate structure that is formed using a replacement gate process. Typically to reduce the incidence of electric shorting between the gate conductors, e.g., metal gate conductors, and the source/drain regions of semiconductor devices formed using replacement gate processes, a high-k dielectric film, such as $HfO_2$, is deposited after the sacrificial gate structure is removed. The high-k dielectric film typically remains in the final semiconductor device structure and extends along the entire height of the functional gate structure. It has been determined that this high-k dielectric film disadvantageously reduces device performance.

For example, a typical thickness for the high-k gate dielectric is approximately 2 nm. As the gate width dimensions shrink down to sub-20 nm regime, e.g., 15 nm and beyond, this 4 nm thickness of high-k dielectric material, i.e., ~2 nm thick layer on each sidewall of the functional structure, amounts to more than 20% of the gate width. In a replacement gate method, in which the functional gate structure is formed in a trench through an intralevel dielectric that is produced by removing a sacrificial gate structure, the high-k dielectric material reduces the width of the trench, and therefore potentially reduces the ease by which the conductive materials for the gate conductor of the replacement gate structure may be deposited within the trench. Further, the reduced thickness of the trench limits the amount of work function adjusting material that may be deposited in the trench, which impacts the tuning of the threshold voltage of the p-type and n-type semiconductor devices to which the functional gate structures are formed.

Further, the high-k dielectric material, e.g., Hf-containing dielectric material, that is extending along the height of the functional gate structures may have a dielectric constant on the order of 20. This is substantially higher than the dielectric constant of the nitride spacers that are also present along the sidewall of the functional gate structure. It has been determined that the higher dielectric constant values of the high-k material can introduce increased parasitic capacitance between functional gate structures and the contact studs and/or bars to the source and drain regions of the semiconductor device. These higher parasitic capacitances degrade the electrical performance of the semiconductor devices.

In one embodiment, the present disclosure provides a method of forming a semiconductor device that removes the majority of the high-k material from the sidewalls of gate conductor of the functional gate structure. By "majority" it is meant that at least the upper half of the sidewall of the gate conductor of the functional gate structure is free of high-k dielectric material.

As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The doping of the source and drain regions of the semiconductor device dictate the conductivity type of the semiconductor device. As used herein, the term "conductivity type" denotes a semiconductor device having a p-type or n-type conductivity.

In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., a functional gate structure, a source region and a drain region. The functional gate structure controls output current, i.e., flow of carriers in the channel, of a semiconducting device, such as a field effect transistor, through electrical or magnetic fields. The channel is the region between the source region and the drain region of a semiconductor device that becomes conductive when the semiconductor device is turned on. A p-type conductivity semiconductor device, such as a pFET, is a semiconductor device in which the source and drain regions of the device are doped with a p-type dopant. An n-type conductivity semiconductor device, such as an nFET, is a semiconductor device in which the source and drain regions of the device are doped with an n-type dopant. Although the semiconductor devices that are depicted in figures of the present disclosure are field effect transistors, the present disclosure is not limited to only this type of semiconductor, because the principles of this disclosure are applicable to any semiconductor device that includes a functional gate structure, in which it is desirable to remove high-k dielectrics from the sidewalls of the functional gate conductor.

FIGS. 1-7 depict one embodiment of a replacement gate method that provides a semiconductor device 100a, 100b including functional gate structures 50a, 50b with a high-k gate dielectric 25a, 25b, in which the high-k gate dielectric layer 25a, 25b is in contact with the base of the gate conductor 26a, 26b, and on the sidewalls of the gate conductor 26a, 26b for a dimension that is less than ¼ the gate structure's height H1. In some embodiments, the sidewalls of the gate conductor 26a, 26b are entirely free of the high-k gate dielectric layer 25a, 25b. The methods and structures disclosed herein are now described in more detail with reference to FIGS. 1-7.

Figure 1:
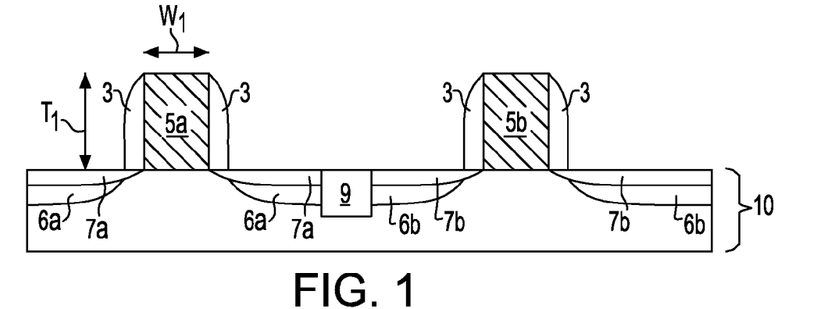
FIG. 1 is a side cross-sectional view of forming replacement gate structures on the substrate and forming source and drain regions on opposing sides of the replacement gate structures, in accordance with one embodiment of the present disclosure.

FIG. 1 depicts forming a replacement gate structure 5a, 5b on a portion of a substrate 10. The substrate 10 may be any silicon-containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The substrate 10 may also include a first doped (n- or p-) region, and a second doped (n- or p-) region. For clarity, the doped regions are not specifically labeled in the drawings of the present application. These doped regions are known as "wells". The substrate 10 may also be composed of compound semiconductor materials, such as type III-V semiconductor.

In one embodiment, the substrate 10 includes an isolation region 9 for separating semiconductor devices of different conductivities. In one embodiment, the isolation region 9 is formed by forming a trench in the substrate 10 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD).

The replacement gate structures 5a, 5b which include a sacrificial material that defines the geometry of later formed functional gate structures that function to switch the semiconductor device from an "on" to "off" state, and vice versa. In one embodiment, and as illustrated in FIG. 1, the replacement gate structure 5a, 5b may be composed of a single layer of sacrificial material. In another embodiment, the replacement gate structure 5a, 5b includes a sacrificial material stack (not depicted) on the substrate 10, in which the sacrificial material stack may be composed of a plurality of layers of sacrificial material.

In one embodiment, the replacement gate structure 5a, 5b may be composed of a semiconductor-containing material, such as a silicon-containing material. Silicon-containing materials that are suitable for the replacement gate structure 5a, 5b include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the replacement gate structure 5a, 5b is amorphous silicon. In some embodiments, other materials, such as dielectrics and metals, can be employed as the sacrificial material of the replacement gate structure 5a, 5b, so long as the material selected can be removed selective to the substrate 10 and the subsequently formed intralevel dielectric.

The sacrificial material layer that provides the replacement gate structure 5a, 5b may be formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The sacrificial material may also be deposited using evaporation, chemical solution deposition, spin on deposition, and physical vapor deposition (PVD) methods.

The sacrificial material may be patterned and etched to provide the replacement gate structure 5a, 5b. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 100:1.

In one embodiment, the etch process removes the exposed portions of the sacrificial material layer with an etch chemistry that is selective to the substrate 10. In one another embodiment, the etch process that forms the replacement gate structures 5a, 5b is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The width W1 of each of the replacement gate structures 5a, 5b may range from 20 nm to 250 nm. In another embodiment, the width W1 of each of the replacement gate structures 5a, 5b may range from 50 nm to 150 nm. In yet another embodiment, the width W1 of the each of the replacement gate structures 5a, 5b may range from 80 nm to 100 nm. The thickness T1 of each of the replacement gate structures 5a, 5b may range from 50 nm to 500 nm. In another embodiment, the thickness T1 of each of the replacement gate structures 5a, 5b may range from about 100 nm to about 200 nm. In yet another embodiment, the thickness T1 of each of the replacement gate structures 5a, 5b may range from 125 nm to 175 nm.

The spacing between adjacent replacement gate structures 5a, 5b dictates the pitch of the subsequently formed functional gate structures. The term "pitch" means the center-to-center distance between two repeating elements of a circuit including semiconductor devices. In one embodiment, the pitch may be measured from the center of the upper surface of a first replacement gate structure 5a to the center of the upper surface of an adjacent replacement gate structure 5b. The actual dimensions for the pitch may depend upon the technology node. In one example, the gate pitch is selected to correspond to the 20 nm technology node. In this example, the gate pitch ranges from 70 nm to 110 nm.

In a following process step, source and drain extension regions 7a, 7b may be formed in the substrate 10 and partially extend under each replacement gate structure 5a, 5b. Source and drain extension regions 7a, 7b are formed via ion implantation. In some embodiments, the substrate may include p-type semiconductor devices 100a and n-type semiconductor devices 100b arranged in a complementary metal oxide semiconductor (CMOS) arrangement, as depicted in FIGS. 1-7.

In the example depicted in FIG. 1, the first replacement gate structure 5a corresponds to a subsequently formed p-type semiconductor device. As used herein, "p-type" refers to the addition of impurities to an intrinsic semiconductor that creates deficiencies of valence electrons. The p-type conductivity semiconductor devices are typically produced within silicon containing substrates by doping the source and drain extension regions 7a adjacent to the first replacement gate structure 5a with elements from group III-A of the Periodic Table of Elements. In a silicon containing substrate, examples of p-type dopants, i.e., impurities, include but are not limited to boron, aluminum, gallium and indium.

In the example depicted in FIG. 1, the second replacement gate structure 5b corresponds to a subsequently formed n-type semiconductor device. As used herein, "n-type" refers to the addition of impurities that contributes free electrons to an intrinsic semiconductor.

The n-type conductivity semiconductor devices are typically produced within silicon containing substrates by doping the source and drain extension regions 7 with elements from group V-A of the Periodic Table of Elements. In a silicon containing substrate, examples of n-type dopants, i.e., impurities, include but are not limited to, antimony, arsenic and phosphorous. In another embodiment, a plurality of semiconductor devices having the same conductivity type (not depicted in FIG. 1) are formed on the same substrate 10.

Still referring to FIG. 1, a low-k dielectric spacer 3 is formed abutting the sidewall surfaces of the replacement gate structures 5a, 5b. The term "low-k" refers to a dielectric material having a dielectric constant that is less than 4.0 at room temperature, i.e., 20° C. to 25° C. In one embodiment, the low-k dielectric spacer 3 has a dielectric constant ranging from 1.75 to 3.5. In another embodiment, the low-k dielectric spacer 3 has a dielectric constant ranging from 2.0 to 3.2. In yet an even further embodiment, the low-k dielectric spacer 3 has a dielectric constant ranging from 2.25 to 3.0. Examples of materials suitable for the low-k dielectric spacer 3 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methyl-silsesquioxane (MSQ), and combinations thereof. In one example, the low-k dielectric spacer 3 may be composed of silicon oxide ($SiO_2$). In yet another embodiment, the low-k dielectric spacer 3 may be composed of silicon nitride ($Si_3N_4$).

The low-k dielectric spacer 3 may be formed by deposition and etching. Typically, the widths of the low-k dielectric spacer 3 should be sufficiently wide enough so that the deep source/drain implants also do not encroach significantly into the channel region of the semiconductor device to cause short channel effects. In one embodiment, the low-k dielectric spacer 3 has a width measured at the bottom of the spacer that is no greater than 20 nm.

In some embodiments, the low-k dielectric spacer 3 may be omitted at this stage of the process sequence. In this embodiment, the low-k dielectric spacer 3 is formed at a later stage of the method sequence, after an intralevel dielectric has been deposited over the replacement gate structures 5a, 5b, and the replacement gate structures 5a, 5b have been removed to provide openings to the substrate 5. In one example, the low-k dielectric spacer 3 may then be formed on the sidewalls of the openings before subsequently described gate dielectric layer is formed.

In one embodiment, a higher energy ion implant is conducted to form deep source and drain regions 6a, 6b. These implants are conducted at a higher energy and higher concentration of dopant than the implant for the source and drain extension regions 7a, 7b. The deep source and drain regions 6a, 6b are typically doped with a conductivity type consistent with the corresponding source and drain extension regions 7a, 7b. For example, similar to the source and drain extension regions 7a to the p-type semiconductor device, the deep source and drain region 6a to p-type semiconductor device are doped with a p-type dopant. For example, similar to the source and drain extension regions 7b to the n-type semiconductor device, the deep source and drain region 6b to the n-type semiconductor device are doped with an n-type dopant. In some embodiments, the deep source and drain regions 6a, 6b may be omitted.

The source region and drain region for each of the n-type and p-type semiconductor devices is a combination of the source and drain extension regions 7a, 7b, and the optional deep source and drain regions 6a, 6b. The source and drain regions may each further include a raised source and drain region (not shown). Raised source and drain regions typically have the same conductivity as the corresponding source and drain extension regions 7a, 7b, and deep source and drain regions 6a, 6b. The raised source and drain region has an upper surface that is vertically offset and above the upper surface of the channel region for the semiconductor device. The raised source and drain regions are typically formed using epitaxial growth, and may be in-situ doped during the growth process. Alternatively, the raised source and drain regions may be implanted using ion implantation following the growth process.

The region for the ion implantation to form the source and drain regions may be dictated using a block mask, in which the block mask protects the region in which the implant dopant is not desired. The block masks that are used to allow for independent processing of the p-type semiconductor device and the n-type semiconductor device may be composed of soft and/or hardmask materials and can be formed using deposition, photolithography and etching. For example, a first block mask (not shown) is formed protecting the region of the substrate 10 in which p-type semiconductor devices are subsequently formed, which also includes the first replacement gate structure 5a. The exposed portion of the substrate 10, which includes the second replacement gate structure 5b, that is not protected by the first block mask is subsequently processed to provide the n-type semiconductor device. For example, the source and drain regions, i.e., source and drain extension regions 7b and deep source and drain regions 6b, are implanted using a n-type dopant, while the region of the substrate 10 that includes the first gate structure 5a is protected by the first block mask. The first block mask is then removed, and a second block mask (not shown) is formed protecting the region of the substrate 10 including the second replacement gate structure 5b, in which the n-type semiconductor device is subsequently formed, while the device region that includes the first gate structure 5a is exposed. P-type conductivity source and drain regions, i.e., source and drain extension regions 7a and deep source and drain regions 6a, are implanted into the region of the substrate 10 including the first gate structure 5a using a p-type dopant, while the region including the second replacement gate 5b and the n-type conductivity source and drain regions, i.e., source and drain extension regions 7b and deep source and drain regions 6b, is protected by the second block mask. The second block mask may then be removed.

The source and drain regions, e.g., deep and drain regions 6a, 6b and source and drain extension regions 7a, 7b, are activated by activation annealing. Activation anneal may be conducted at a temperature ranging from 850° C. to 1350° C.

Figure 2:
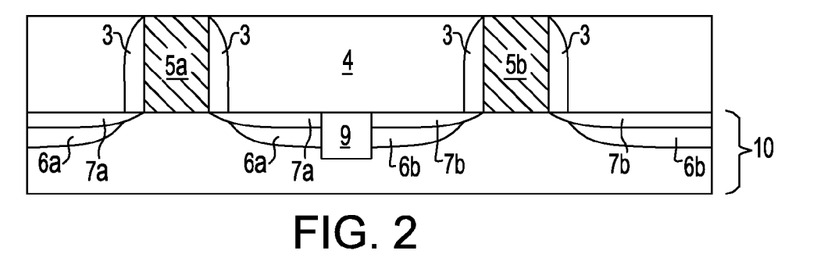
FIG. 2 is a side cross-sectional view of forming an intralevel dielectric on the substrate having an upper surface that is coplanar with an upper surface of the replacement gate structures, in accordance with one embodiment of the present disclosure.

Referring to FIG. 2, an intralevel dielectric 4 is formed on the substrate 10 having an upper surface that is coplanar with an upper surface of the replacement gate structures 5a, 5b. The intralevel dielectric 4 may be blanket deposited atop the entire substrate 10 and planarized. The blanket dielectric may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). Additional choices for the blanket dielectric includes any of the aforementioned materials in porous form, or in a form that changes during processing to or from being porous and/or permeable to being non-porous and/or non-permeable.

The intralevel dielectric 4 may be formed using a deposited process, such as chemical vapor deposition (CVD). Variations of CVD processes that are suitable for forming the intralevel dielectric layer 4 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The intralevel dielectric 4 may also be deposited using evaporation, chemical solution deposition, spin on deposition, and physical vapor deposition (PVD) methods.

Following deposition, the intralevel dielectric 4 may be planarized so that the upper surface of the intralevel dielectric 4 is coplanar with the upper surface of the replacement gate structures 5a, 5b, as depicted in FIG. 2. Planarization is a material removal process that employs at least mechanical forces, such as frictional media, to produce a planar surface. The intralevel dielectric layer 4 may be planarized using chemical mechanical planarization (CMP). Chemical mechanical planarization (CMP) is a material removal process using both chemical reactions and mechanical forces to remove material and planarize a surface.

Figure 3:
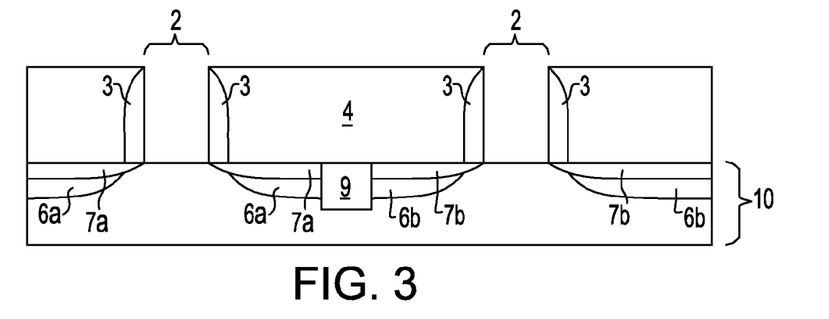
FIG. 3 is a side cross-sectional view of removing the replacement gate structures to provide openings to exposed portions of the substrate, in accordance with one embodiment of the present disclosure.

FIG. 3 depicts one embodiment of removing the replacement gate structures 5a, 5b to provide an opening 2 to an exposed portion of the substrate 10. The replacement gate structures 5a, 5b are typically removed using a selective etch process that removes the replacement gate structures 5a, 5b selective to the substrate 10, the low-k dielectric spacer 3 and the intralevel dielectric 4. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the replacement gate structures 5a, 5b are composed of polysilicon, the substrate 10 is a silicon-containing material, and the low-k dielectric spacer 3 is composed of silicon oxide ($SiO_2$), the intralevel dielectric 4 is composed of nitride ($Si_3N_4$), the wet etch chemistry for removing the replacement gate structures 5a, 5b may be composed of DHF and hot $NH_3$, or TetraMethyl Ammonium Hydroxide (TMAH).

Figure 4:
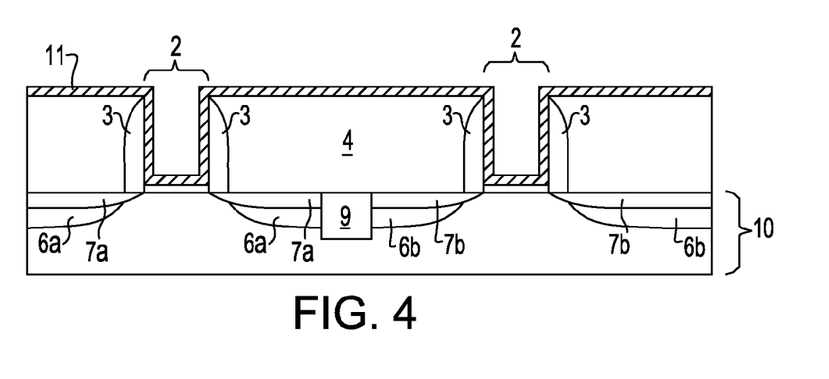
FIG. 4 is a side cross-sectional view of forming a gate dielectric layer on at least the sidewalls of the openings through the intralevel dielectric layer, and on the portions of the substrate exposed by the openings through the intralevel dielectric layer, in accordance with one embodiment of the present disclosure.

FIG. 4 depicts one embodiment of forming a high-k gate dielectric layer 11 on sidewalls of the opening 2. In one embodiment, the high-k gate dielectric layer 11 is formed in direct contact with the sidewalls of the low-k dielectric spacer 3. The term "high-k" denotes a material having a dielectric constant that is greater than the 10, e.g., 10.1. In another embodiment, the high-k gate dielectric layer 11 is comprised of a material having a dielectric constant greater than 15.0. In yet another embodiment, the high-k gate dielectric layer 11 is comprised of a material having a dielectric constant ranging from 10 to 30. The dielectric constants mentioned herein are relative to a vacuum at room temperature, i.e., 20° C. to 25° C.

Some examples of high-k dielectric materials suitable for the high-k gate dielectric layer 11 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k gate dielectric layer 11 is hafnium oxide ($HfO_2$).

In one embodiment, the high-k gate dielectric layer 11 is formed using deposition methods.

The layer of high-k dielectric material is typically a conformal layer that is formed using a conformal deposition process. The term "conformal" denotes a layer having a thickness that does not deviate from greater than or less than 30% of an average value for the thickness of the layer. In one example, the high-k gate dielectric layer 11 is formed in direct contact with the upper surface of the intralevel dielectric 4, the exposed sidewall surfaces of the low-k dielectric spacer 3 that provide the sidewalls of the opening 2, and the base of the opening 2, i.e., exposed portion of the substrate 10.

In one embodiment, the high-k gate dielectric layer 11 is formed using a deposition process, such as chemical vapor deposition (CVD). Variations of chemical vapor deposition (CVD) processes for depositing the layer of the high-k dielectric material include, but are not limited to, Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the high-k gate dielectric layer 11 may be formed by a thermal growth process such as, for example, oxidation, nitridation or oxynitridation.

The high-k gate dielectric layer 11 has a width as measured from the sidewall of the low-k dielectric spacer 3 that ranges from 0.5 nm to 10 nm. In another embodiment, the high-k gate dielectric layer 11 has a width as measured from the sidewall of the low-k dielectric spacer 3 that ranges from 1 nm to 5 nm.

In one embodiment, prior to forming a high-k dielectric layer 11, an interfacial dielectric layer (not shown) is formed on the exposed portion of the substrate 10. The interfacial dielectric layer is typically provided by thermal oxidation of the exposed surface of the substrate 10 that is present at the base of the opening 2. In one embodiment, thermal oxidation of silicon is performed in the presence of oxygen at a temperature between 800° C. and 1200° C. In some examples, the oxidant may be either water vapor (steam) or molecular oxygen. In another embodiment, the interfacial dielectric layer is an oxide that is formed using deposition. In some embodiments, the interfacial dielectric layer is composed of silicon oxide and has a thickness that ranges from 1 nm to 5 nm. In one embodiment, high-k gate dielectric layer 11 is formed in direct contact with the interfacial dielectric layer at the base of the opening 2.

Figure 5:
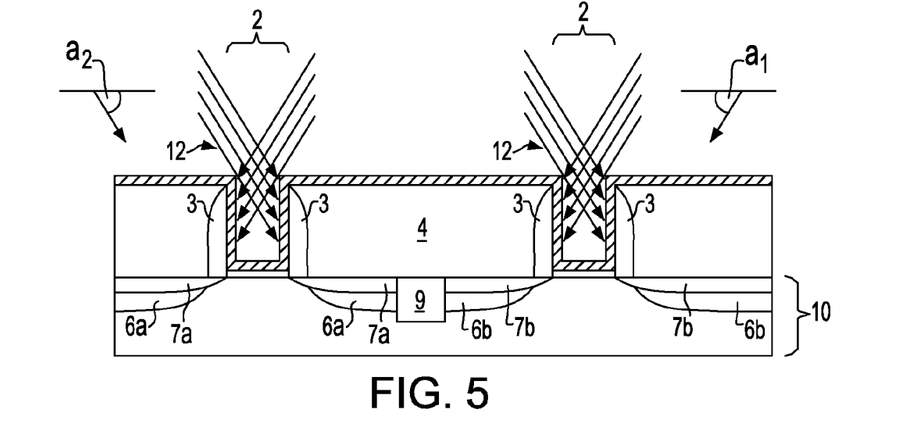
FIG. 5 is a side cross-sectional view of damaging at least a majority of the gate dielectric layer that is present on the sidewalls of the openings with an angled ion implantation, wherein a non-damaged portion of the gate dielectric layer is present at a base of the openings, in accordance with one embodiment of the present disclosure.

FIG. 5 depicts one embodiment of damaging at least a majority of the high-k gate dielectric layer 11 that is present on the sidewalls of the opening 2 with an angled ion implantation 12. In one embodiment, the angled ion implant 12 forms a damaged portion of the high-k gate dielectric layer 11 on the sidewalls of the opening 2, e.g., damaged portion of the high-k gate dielectric 11 that is in direct contact with the low-k dielectric spacer 3, wherein a non-damaged portion of the high-k gate dielectric layer 11 is present at the base of the opening 2. Typically, in addition to damaging the high-k gate dielectric layer 11 on the sidewalls of the opening 2, the angled ion implantation 12 also damages the high-k gate dielectric layer 11 that is present on the upper surface of the intralevel dielectric 4.

The term "damaged" implies the presence of a dopant that increases the etch rate of the high-k gate dielectric 11 in comparison to the remainder of the high-k gate dielectric layer 11 in which the dopant is not present. For example, the damaged portion of the high-k gate dielectric layer 11 may be etched selectively to the undamaged portion of the high-k gate dielectric layer 11 with a selectivity of 100:1 or greater. In another example, the selectivity by which the damaged portion of the high-k gate dielectric layer 11 is etched to the undamaged portion of the high-k gate dielectric layer 11 is greater than 10:1. In one embodiment, the damaged portion of the high-k gate dielectric 11 that is subject to implantation has a crystalline structure, such as the lattice structure, that has been altered by the implanted species. In another example, the damaged portion of the high-k gate dielectric layer 11 that has been subjected to implantation has an increased porosity when compared to the portion of the high-k gate dielectric layer 11 that has not been subjected to implantation, i.e., non-damaged portion.

In one embodiment, the damaged portion of the high-k gate dielectric layer 11 is provided by ion implantation of at least one ion of H, He, Ne, C, O, F, B, P, Ar, or Si, including isotopes thereof. In one embodiment, the dopant that is implanted into the damaged portion of the high-k gate dielectric layer 11 is argon (Ar+). In one embodiment, the ions are implanted using an ion dosage ranging from $1\times10^{14}$ atoms/cm$^2$ to $3\times10^{16}$ atoms/cm$^2$, with an ion dosage ranging from $2\times10^{14}$ atoms/cm$^2$ to $2.8\times10^{16}$ atoms/cm$^2$ being more typical. The ion implantation is typically carried out in an ion implantation apparatus that operates at a beam current density from 0.05 milliamps cm$^{-2}$ to 50 milliamps cm$^{-2}$ and at an energy from 4 keV to 250 keV. In one embodiment, the implant is performed using an energy from 5 keV to 200 keV.

The ion implantation apparatus is angled so that the vector by which the ions are traveling contacts the surface being implanted at an angle α1, α2 of less than 85° relative to the plane that is parallel to the upper surface of the substrate 10. The angle by which the implant dopant is introduced to the damaged portion of the high-k gate dielectric layer 11 is selected so that the implant dopant damages the portion of the high-k gate dielectric layer 11 that is present on the sidewall of the opening 2, e.g., present on the sidewall of the low-k dielectric spacer 3, and so that the implant dopant does not damage the portion of the high-k gate dielectric layer 11 that is present at the base of the opening 2.

In one embodiment, the angle α1, α2 at which the ions contact the implanted surface ranges from 15° to 75°. In yet another embodiment, the angle α1, α2 at which the ions contact the implanted surface ranges from 25° to 65°. It is noted that the above angles are provided for illustrative purposes only, and that other angles can be employed and are within the scope of the present disclosure. For example, other angles may be employed so long as the angle selected introduces the implant dopant to the portion of the high-k gate dielectric layer 11 that is present within the opening 2, and only on the sidewall portion of the high-k gate dielectric layer 11 that is present in the opening 2.

In one embodiment, the angled ion implantation includes two angles α1, α2, in which each angle is selected to damage the high-k gate dielectric layer 11 on each sidewall of the opening 2. In one embodiment, each sidewall portion of the high-k gate dielectric layer 11 is implanted once, and the portion of the high-k gate dielectric layer 11 that is present on the upper surface of the intralevel dielectric 4 is implanted twice.

Figure 6:
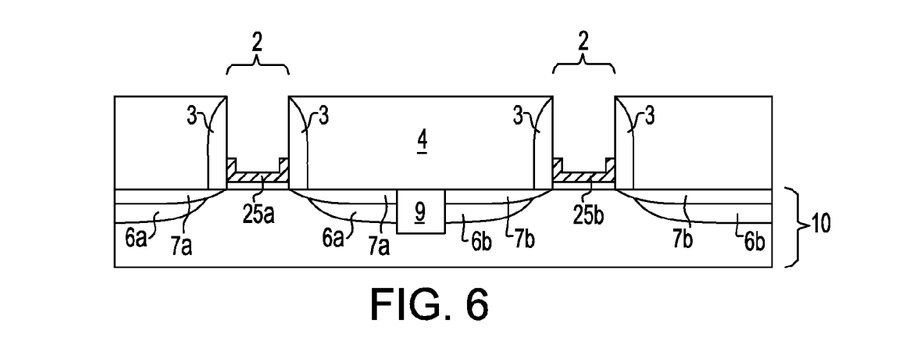
FIG. 6 is a side cross-sectional view of removing the damaged portions of the gate dielectric layer selectively to the non-damaged portions of the gate dielectric layer, in accordance with one embodiment of the present disclosure.

FIG. 6 depicts removing the damaged portion of the high-k gate dielectric layer 11 selective to the portion the high-k gate dielectric layer 11 that is not damaged. In one example, the damaged portion of the high-k gate dielectric layer 11 may be removed by one or more etching steps. In one embodiment, the damaged portion of the high-k gate dielectric layer 11 is removed by a wet or dry etch process, which is selective to the non-damaged portion of the high-k gate dielectric layer 11. In one embodiment, the selectivity by which the damaged portion of the high-k gate dielectric layer 11 is removed to the non-damaged portion of the high-k gate dielectric layer 11 ranges from 10:1.

In one embodiment, in which the high-k gate dielectric layer 11 is composed of hafnium oxide, and is damaged by ion implantation of Ar, the etch chemistry for removing the damaged portion of the high-k gate dielectric layer 11 selective to the non-damaged portion of the high-k gate dielectric layer 11 is composed of dilute HF (DHF). The non-damaged portion of the high-k gate dielectric layer 25a, 25b remains on the base portion of the openings 2, which is hereafter referred to as the remaining portion of the high-k gate dielectric layer 25a, 25b.

Figure 7:
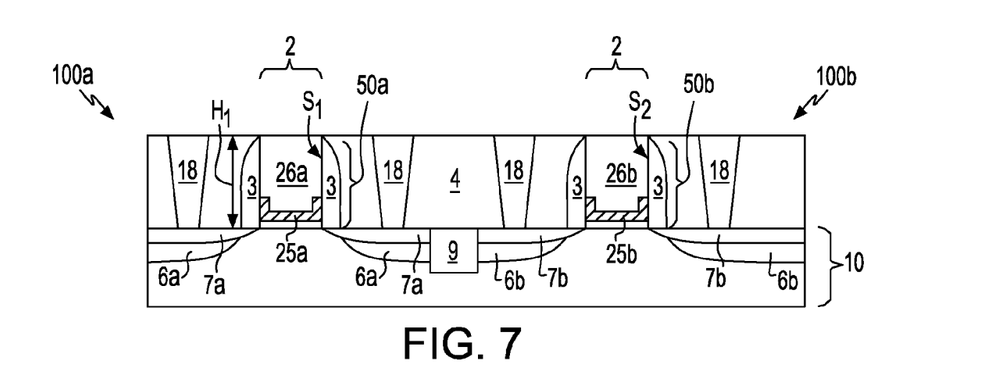
FIG. 7 is a side cross-sectional view of forming a functioning gate structure within the opening on the non-damaged portions of the gate dielectric layer, in accordance with one embodiment of the present disclosure.

FIG. 7 depicts one embodiment of forming the gate conductor 26a, 26b of the functioning gate structure 50a, 50b within the openings 2 to the non-damaged portions of the gate dielectric layer 25a, 25b. In one embodiment, the work functional metal layer is present within the openings 2 in direct contact with the remaining portions of the high-k gate dielectric layer 25a, 25b. The work functional metal layer may be a conformally deposited layer that is present on the sidewalls of the openings 2, e.g., exposed sidewalls of the low-k dielectric spacer 3, and on the remaining portion of the high-k gate dielectric layer 25a, 25b.

In one embodiment, in which the semiconductor device is an n-type semiconductor device 100b, the work function metal layer is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer is composed of at least one of TiAl, TanN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

In the embodiment, in which the semiconductor device is a p-type semiconductor device 100a, the work function metal layer may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In one embodiment, the work function metal layer is a conformally deposited layer, in which the work function metal layer is present on the remaining portions of the high-k dielectric layer 25a, 25b at the base of the openings 2, and is also present on the exposed sidewalls of the openings 2, wherein a void remains in each of the openings 2. The work function metal layers of the gate conductors 26a, 26b that are within the openings 2 may have a thickness ranging from 1 nm to 50 nm. In another embodiment, the work function metal layers that is present in the opening 2 may have a thickness ranging from 5 nm to 30 nm.

Still referring to FIG. 7, the gate conductors 26a, 26b may further includes a metal-containing layer may be deposited on within the void contained within the openings 2 and positioned on the work function metal layer. The metal-containing layer may be deposited to fill the openings 2. In some embodiments, the metal-containing layer is formed in direct contact with the work function metal layer of the gate conductors 26a, 26b. In one embodiment, the metal-containing layer is composed of aluminum. In another embodiment, the metal-containing layer is composed of titanium or copper. The metal-containing layer is typically deposited by physical vapor deposition (PVD), such as sputtering or plating. Examples of sputtering apparatus that may be suitable for depositing the metal-containing layer comprising aluminum includes DC diode type systems, radio frequency (RF) sputtering, magnetron sputtering, and ionized metal plasma (IMP) sputtering. In addition to physical vapor deposition (PVD) techniques, the metal-containing layer 13 comprising aluminum may also be formed using chemical vapor deposition (CVD).

The metal-containing layer may be deposited to fill the openings 2. The metal-containing layer may be planarized until an upper surface of the metal-containing layer is coplanar with an upper surface of the intralevel dielectric 4, as depicted in FIG. 7. In one example, the planarization process is provided by chemical mechanical planarization (CMP). In one embodiment, the planarization process removes the portions of the metal-containing layer that is present on the upper surface of the intralevel dielectric 4. The metal-containing layer and the work function metal layer provide the gate conductors 26a, 26b of the functioning gate structure 50a, 50b. The functioning gate structure 50a, 50b is the structure used to control output current, i.e., flow of carriers in the channel, of the semiconducting device, such as a field effect transistor, through electrical or magnetic fields. The functioning gate structure 50a, 50b is further composed of the remaining portions of the high-k gate dielectric layer 25a, 25b.

The selectivity by which the materials are deposited for the work function metal layer and the metal-containing layer for the gate conductors 26a, 26b to the p-type semiconductor device 100a and n-type semiconductor device 100b may be provided by employing block masks that are similar to those described above for selectively implanting the source and drain regions of the p-type semiconductor device 100a and the n-type semiconductor device 100b.

Referring to FIG. 7, the intralevel dielectric 4 may be patterned and etched to form via holes to the various source and drain regions, i.e., source and drain extension regions 7a, 7b and deep source and drain regions 6a, 6b, of the substrate 10. A photoresist etch mask (not shown) can be produced by applying a photoresist layer to the surface of the intralevel dielectric layer 4, exposing the photoresist layer to a pattern of radiation, and then developing the pattern into the photoresist layer utilizing a resist developer. The exposed portion of the intralevel dielectric layer 4 is then removed by a selective etch. The selective etch may be an anisotropic etch or an isotropic etch. The via holes are then extended through the intralevel dielectric 4 to the source and drain regions, i.e., deep source and drain regions 6a, 6b and source and drain extension regions 7a, 7b that are present within the substrate 10. Following via hole formation, interconnects 18 (hereafter referred to as "contacts") are formed by depositing a conductive metal into the via holes using deposition methods, such as CVD or plating. The conductive metal may include, but is not limited to, tungsten, copper, aluminum, silver, gold, and alloys thereof.

Referring to FIG. 7, in one embodiment, a semiconductor device 100a, 100b is provided that includes a gate structure 50a, 50b on a semiconductor substrate 10, in which the gate structure 50a, 50b is comprised of a gate conductor 26a, 26b and a high-k gate dielectric layer 25a, 25b. In some embodiments, when viewing a cross-sectional side view of the semiconductor device 100a, 100b, the high-k gate dielectric layer 25a, 25b of the functional gate structure 50a, 50b has a "U" shaped geometry with a planar base. The high-k gate dielectric layer 25a, 25b is in contact with the base of the gate conductor 26a, 26b. In one embodiment, the high-k gate dielectric layer 25a, 25b is also present on a portion of the sidewalls S1, S2 of the gate conductor 26a, 26b for a dimension that is less than ¼ the functional gate structure's height H1. In another embodiment, the high-k gate dielectric layer 25a, 25b is present on a portion of the sidewalls S1, S2 of the gate conductor 26a, 26b for a dimension that is less than ⅛th of the functional gate structure's height H1. In yet another embodiment, the high-k gate dielectric layer 25a, 25b is present on a portion of the sidewalls S1, S2 of the gate conductor 26a, 26b for a dimension that is less than ¹⁄₁₆th of the functional gate structure's height H1. For example, in one embodiment, the high-k gate dielectric layer 25a, 25b is present on a portion of the sidewalls S1, S2 of the gate conductor 26a, 26b for a dimension equal to 10 Å to 30 Å. In one example, the high-k gate dielectric layer 25a, 25b is only present in direct contact with the base surface of the gate conductor 26a, 26b and does not extend along the gate conductor's sidewall S1, S2.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A method of forming a semiconductor device comprising:
   forming a replacement gate structure on a portion of a substrate, wherein source regions and drain regions are positioned on opposing sides of the replacement gate structure;
   forming an intralevel dielectric on the substrate having an upper surface that is coplanar with an upper surface of the replacement gate structure;
   removing the replacement gate structure to provide an opening to an exposed portion of the substrate, wherein sidewalls of the opening are provided by sidewalls of a remaining portion of the intralevel dielectric;
   forming a gate dielectric layer on at least the sidewalls of the opening and the exposed portion of the substrate;
   damaging a majority of the gate dielectric layer that is present on the sidewalls of the opening with an angled ion implantation, wherein a non-damaged portion of the gate dielectric layer is present at a base of the opening;
   removing the damaged portion of the gate dielectric layer selectively to the non-damaged portion of the gate dielectric layer; and
   forming a gate conductor of a functioning gate structure within the opening on the non-damaged portion of the gate dielectric layer.

2. The method of claim 1, wherein the gate dielectric layer is composed of a high-k dielectric material.

3. The method of claim 1, wherein a spacer is present in direct contact with the sidewalls of the intralevel dielectric layer, and the gate dielectric layer is in direct contact with the spacer.

4. The method of claim 3, wherein the spacer is formed on a sidewall of the replacement gate structure prior to the forming of the intralevel dielectric, or the spacer is formed after on the sidewall of the intralevel dielectric after the replacement gate structure is removed and before the gate dielectric layer is formed.

5. The method of claim 1, further comprising forming interconnects through the intralevel dielectric layer to at least one of the source region and the drain region.

6. The method of claim 1, wherein the forming of the intralevel dielectric on the substrate having an upper surface that is coplanar with an upper surface of the replacement gate structure comprises depositing the intralevel dielectric over the substrate and the replacement gate structure, and planarizing the intralevel dielectric until the upper surface of the replacement gate structure is exposed.

7. The method of claim 1, wherein the removing of the replacement gate structure to provide an opening to the exposed portion of the substrate comprises an etch that removes the replacement gate structure selective to the intralevel dielectric and the exposed portion of the substrate.

8. The method of claim 3, wherein the forming of the gate dielectric layer further comprises forming an interfacial dielectric layer on the exposed portion of the substrate, and forming the gate dielectric layer in direct contact with the interfacial dielectric.

9. The method of claim 3, wherein the forming of the gate dielectric layer comprises a conformal deposition on the sidewalls of the opening, the exposed portion of the substrate, and an upper surface of the intralevel dielectric layer.

10. The method of claim 2, wherein the high-k dielectric material comprises a hafnium-containing material.

11. The method of claim 1, wherein the damaging of the majority of the gate dielectric layer that is present on the sidewalls of the opening with an angled ion implantation comprises implantation of at least one dopant from the group consisting of H, He, Ne, C, O, F, B, P, Ar, Si, including isotopes thereof, and combinations thereof.

12. The method of claim 1, wherein the damaging of the majority of the gate dielectric that is present on the sidewalls of the opening with an angled ion implantation comprises an ion dosage from $1\times10^{14}$ atoms/cm$^2$ to $3\times10^{16}$ atoms/cm$^2$.

13. The method of claim 1, wherein the damaging of the majority of the gate dielectric layer that is present on the sidewalls of the opening with an angled ion implantation comprises an ion implantation apparatus that operates at a beam current density from 0.05 milliamps cm$^{-2}$ to 50 milliamps cm$^{-2}$ and at an energy from 3 keV to 250 keV.

14. The method of claim 1, wherein the angled ion implantation comprises a vector by which ions are traveling to contact a surface being damaged at a contact angle of less than 85°.

15. The method of claim 1, wherein the removing of the damaged portion of the gate dielectric layer selectively to the non-damaged portion of the gate dielectric layer comprises an etch that has a selectivity greater than 100:1 for removing the damaged portion of the gate dielectric layer to the non-damaged portion of the gate dielectric layer.

16. The method of claim 1, wherein the non-damaged portion of the gate dielectric layer provides a gate dielectric for the functional gate structure, wherein the gate dielectric of the functional gate structure is in contact with the gate conductor of the functional gate structure, and the gate dielectric is in direct contact with sidewalls of the gate conductor for a dimension that is less than ¼ the height of the gate structure.

* * * * *